United States Patent
Shah et al.

(10) Patent No.: US 7,813,885 B2
(45) Date of Patent: Oct. 12, 2010

(54) METHOD AND APPARATUS FOR MEASUREMENT OF AC VOLTAGES IN AN HVAC SYSTEM

(75) Inventors: Rajendra K. Shah, Indianapolis, IN (US); William F. Van Ostrand, Indianapolis, IN (US)

(73) Assignee: Carrier Corporation, Farmington, CT (US)

( * ) Notice: Subject to any disclaimer, the term of this patent is extended or adjusted under 35 U.S.C. 154(b) by 760 days.

(21) Appl. No.: 11/645,956

(22) Filed: Dec. 27, 2006

(65) Prior Publication Data

US 2007/0170171 A1    Jul. 26, 2007

Related U.S. Application Data

(60) Provisional application No. 60/760,541, filed on Jan. 20, 2006.

(51) Int. Cl.
*G01R 19/00*    (2006.01)

(52) U.S. Cl. .................. 702/64; 702/104; 324/76.12
(58) Field of Classification Search .................. 702/57, 702/64–66, 79, 89, 104, 176–178; 324/74, 324/76.11, 76.12, 100, 99 D, 103 P, 103 R; 340/660–663; 165/11.1, 11.2
See application file for complete search history.

(56) References Cited

U.S. PATENT DOCUMENTS

| | | | | |
|---|---|---|---|---|
| 3,720,813 | A | * | 3/1973 | Badessa .................. 702/85 |
| 4,558,226 | A | * | 12/1985 | Takada et al. .............. 250/551 |
| 6,826,454 | B2 | * | 11/2004 | Sulfstede .................. 700/276 |

* cited by examiner

*Primary Examiner*—Manuel L Barbee
(74) *Attorney, Agent, or Firm*—Cantor Colburn LLP

(57) ABSTRACT

A control system to measure a sinusoidal AC voltage in a heating, ventilation includes a controller and a circuit connected to the controller. The circuit generates a pulse voltage based upon the AC voltage. The pulse voltage has a pulse duration. The controller measures a measured pulse duration based on the pulse duration and determines the AC voltage based upon the measured pulse duration.

14 Claims, 3 Drawing Sheets

METHOD AND APPARATUS FOR MEASUREMENT OF AC VOLTAGES IN AN HVAC SYSTEM

CROSS REFERENCE TO RELATED APPLICATIONS

This, application claims priority to U.S. Provisional Application Ser. No. 60/760,541, filed Jan. 20, 2006, the disclosure of which is incorporated herein by reference.

BACKGROUND OF THE INVENTION

1. Field of the Invention

This invention relates generally to heating, ventilation, and air conditioning (HVAC) systems and, more particularly, a method and apparatus for measuring AC voltages in an HVAC system.

2. Description of the Related Art

Residential heating, ventilating and air conditioning (HVAC) systems typically have not incorporated sophisticated controls. Only recently have such systems begun to include microprocessor based electronic controls. The controls enable new functions and features in these systems and improve their performance, reliability and/or serviceability. Generally, the controls receive command inputs from a device such as a room thermostat that senses various parameters within the system and other control system devices such as a compressor or a fan motor. To maintain their affordability in the mass market, residential HVAC systems and their controls cannot bear the burden of high cost or complexity.

Some HVAC systems employ starting components to help start the compressor motor. A start capacitor is used to put extra current in the start winding of the motor to get it started. A voltage sensing relay is placed across this start winding. As the compressor motor speeds up, the start winding voltage increases. When the voltage crosses the threshold for the voltage sensing relay, indicating a proper start, the relay switches out the start capacitor which is no longer needed. It should be noted that this voltage threshold is determined by the physical properties of the relay and is fixed for any particular system. Undesirably, this means the relay cannot be changed when system conditions require a different threshold. On the other hand, it is not very accurate: it varies from system to system based on relay parameter tolerances and also varies with ambient air temperature. This variability can effect the consistency of compressor starting as well as the reliability of the start components themselves. Finally, the sensed condition of the relay stays within the relay itself and this information is not available to any microprocessor controlling the system.

Today's residential HVAC systems, even those with microprocessor controls, do not incorporate any means to measure AC voltages, primarily because of cost and complexity constraints. Digital voltmeters that can measure AC Voltage are common laboratory instruments. Analog to digital converters are often used in sophisticated data acquisition systems, industrial controls etc. However, such devices are not practically capable of meeting all the requirements of the residential HVAC application at an acceptable cost.

Accordingly, there is a need for an improved method and apparatus for measuring AC voltage in HVAC systems and analogous heating, ventilating, and/or air conditioning systems.

SUMMARY OF THE INVENTION

A control system to measure AC voltage in a heating, ventilation, and air conditioning system is provided. The system includes a controller and a circuit connected to the controller. The circuit generates a pulse voltage based upon the AC voltage. The pulse voltage has a pulse duration. The controller measures a measured pulse duration based on the pulse duration and determines the AC voltage based upon the measured pulse duration.

A method of measuring voltage in a heating, ventilation, and air conditioning system is also provided. The method includes converting a sinusoidal voltage into a measured pulse, measuring a measured pulse duration of the measured pulse, and converting the measured pulse duration into a measured voltage.

The controller may be a microprocessor that controls the heating, ventilation, and air conditioning system. The circuit may be a plurality of circuits and the controller and the plurality of circuits may measure multiple voltages from the heating, ventilation, and air conditioning system. The controller may be subjected to a calibration process by applying a known AC reference voltage to the circuit, converting the AC reference voltage into a reference pulse, measuring a duration of the reference pulse, and storing values of the AC reference voltage and the duration in the controller's memory. The AC voltage may be determined based upon the duration by a mathematical formula using the values of the AC reference voltage and the duration from the calibration process. The mathematical formula may be AC voltage=AC reference voltage*[sin(90 deg.−½ reference pulse duration)]/[sin(90 deg.−½ measured pulse duration)] and the measured pulse duration and the reference pulse duration are both expressed in angular degrees of the sinusoidal wave. The circuit may include a first resistor network, an optical isolator having a diode portion and a transistor portion, and a second network having a plurality of resistors and a transistor. The first resistor network may divide an input sinusoidal AC voltage by a fixed ratio. The input sinusoidal AC voltage that is divided may be sensed by the optical isolator diode portion. The second network may be connected to the transistor portion such that a first voltage level is generated while the input sinusoidal AC voltage is above a fixed threshold and a second voltage level is generated while the input sinusoidal AC voltage is below the fixed threshold thereby generating a pulse voltage based on the input sinusoidal AC voltage with the optical isolator electrically isolating the first resistor network from the second network. The circuit may further comprise a parallel resistor that is connected across the diode portion of the optical isolator and has an electrical resistance which is selected to substantially cancel effects of decreasing current transfer ratio of the optical isolator and decreasing forward drop of the diode portion of the optical isolator as temperature increases.

The method may further comprise calibrating a control that has a controller and a circuit and the calibrating may comprise applying a known voltage to the circuit, converting a known sine wave of the known voltage into a reference pulse, measuring a reference pulse duration of the reference pulse, and converting the reference pulse duration into a reference voltage. The measured voltage may be determined by a mathematical formula that includes said measured voltage=reference voltage*[sin(90 deg.−½ reference pulse duration)]/[sin(90 deg.−½ measured pulse duration)]. The method may further comprise substantially electrically isolating the controller from the sinusoidal voltage.

The above-described and other features and advantages of the present disclosure will be appreciated and understood by those skilled in the art from the following detailed description, drawings, and appended claims.

DETAILED DESCRIPTION OF THE INVENTION

Figure 1:
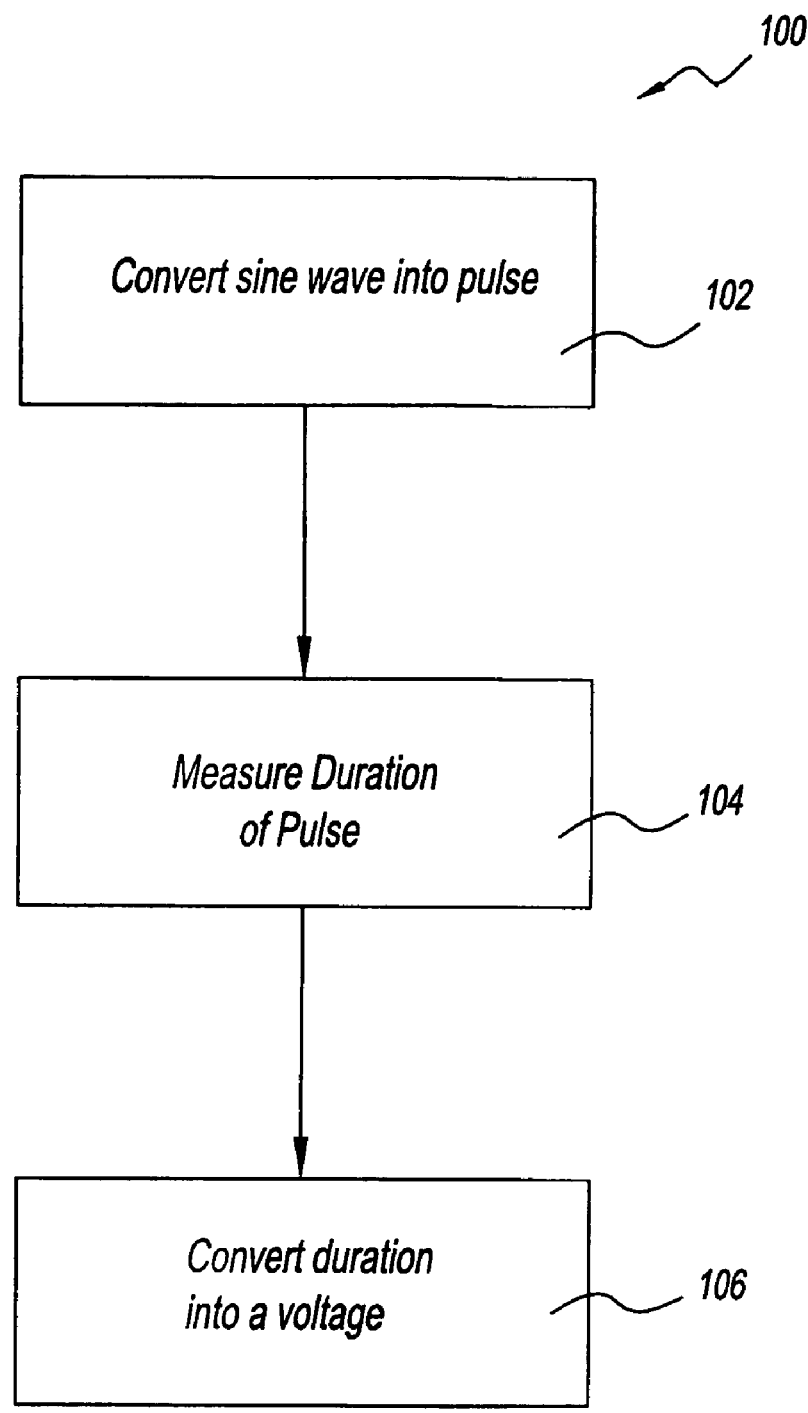
FIG. 1 is a schematic diagram of an exemplary embodiment of a method for measuring AC voltages in an HVAC system of the present invention.

Referring now to FIG. 1, an exemplary embodiment of a method of measuring AC voltage in HVAC systems and analogous heating, ventilating, and/or air conditioning systems generally referred to by reference numeral 100 is illustrated. AC voltage that is to be measured has a generally sinusoidal waveform. A sinusoidal wave of an applied AC voltage is converted into a pulse, as in step 102 of FIG. 1. Preferably, the pulse is an isolated low voltage pulse. The sinusoidal voltage may be fed into a circuit. The circuit may be made up of commonly available low cost components, such as, for example, resistors, diodes, transistors, optical isolators, and the like. The pulse has a duration that is a function of a measured voltage. The duration is measured, as in step 104 of FIG. 1, to obtain a duration time. The duration time is converted into a measured voltage, as in step 106 of FIG. 1. Preferably, a control microprocessor measures the duration of each pulse and from that information calculates the measured voltage, such as, for example, using commonly known trigonometric principles. Method 100 may be used in an HVAC system's control microprocessor to measure high line and motor voltages, such as, for example, voltages of about 150 volts to about 500 volts. The measurement of voltages of the HVAC system may enable multiple functions such as compressor starting, system protection, and/or diagnostics. The microprocessor controller and multiple circuits may measure multiple voltages from the heating, ventilation, and air conditioning system.

Figure 1A:
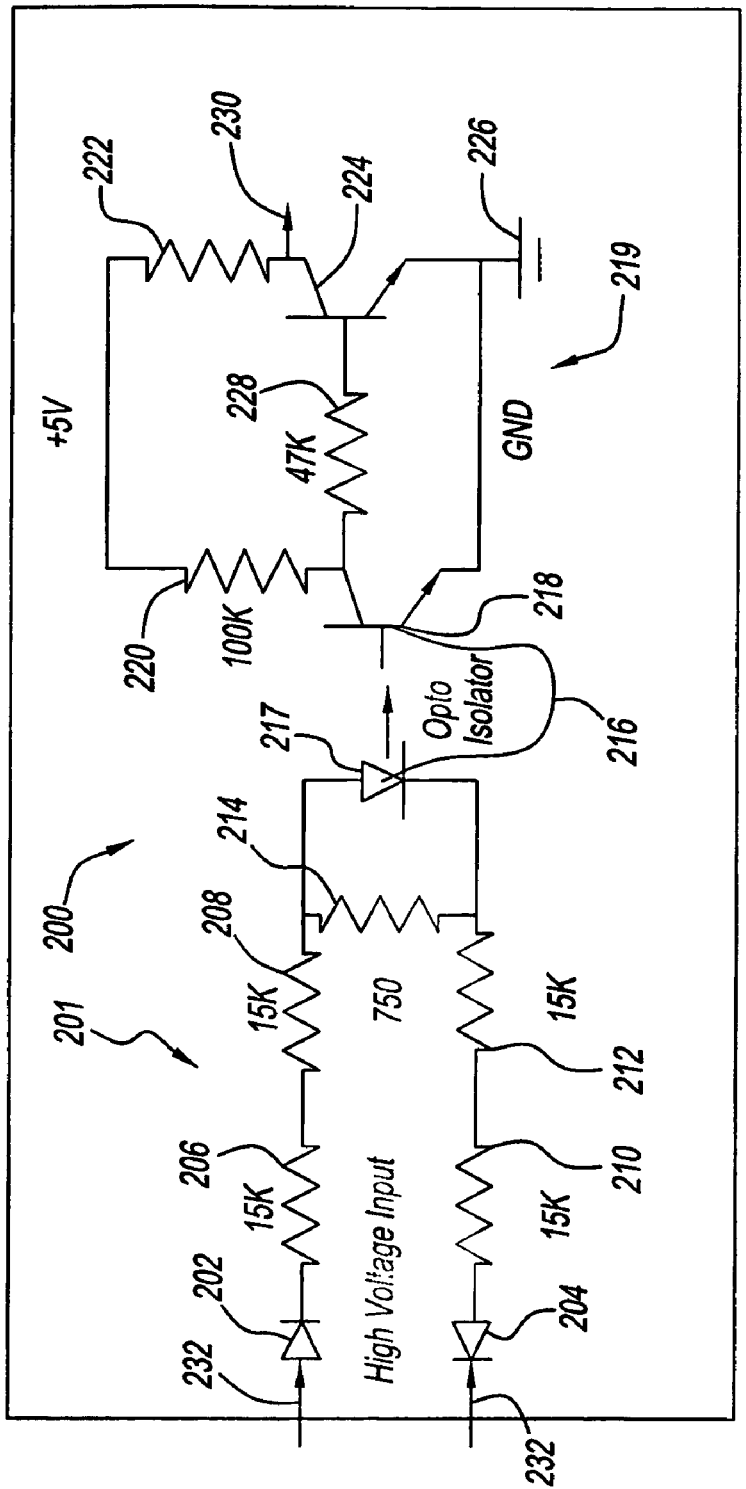
FIG. 1A schematically depicts an exemplary embodiment of a circuit of the present invention.

The circuit that receives AC or sinusoidal voltage from the HVAC system may have a circuit configuration 200 shown in FIG. 1A. Circuit configuration 200 may have a first portion or LED 201, a first diode 202, a second diode 204, a first resistor 206, a second resistor 208, a third resistor 210, a fourth resistor 212, and a fifth resistor 214, and an optical isolator 216. Optical isolator has an optical isolator diode portion 217 and an optical isolator transistor portion 218. Optical isolator transistor portion 218, preferably, is connected to a second portion 219 of circuit configuration 200, a sixth resistor 220, a seventh resistor 222, a first transistor 224, ground 226, and an eighth resistor 228. Preferably, first resistor 206, second resistor 208, third resistor 210, fourth resistor 212, and seventh resistor 222 are 15 kilo-ohm (kΩ) resistors, fifth resistor 214 is a 750 ohm resistor, and eighth resistor 228 is a 47 kΩ resistor. Circuit configuration 200 may be manufactured at a low cost, such as, for example, less than $1 worth of components.

The sinusoidal voltage is applied across first diode 202 and second diode 204, as shown by arrows 232. The sinusoidal voltage has a positive half cycle that causes a current to flow through first diode 202, second diode 204, first resistor 206, second resistor 208, third resistor 210, fourth resistor 212, and fifth resistor 214. When the input voltage exceeds a threshold value, a fifth resistor drop across fifth resistor 214 increases to overcome the threshold voltage, such as, for example, about 1 volt, of the optical isolator 216 and the current will flow through optical isolator diode portion 217. When the current flows, optical isolator transistor portion 218 conducts enough current to turn off first transistor 224, so that an increased voltage such as, for example, nearly 5 volts, conducts to the microprocessor. The increased voltage is relatively abrupt due to the threshold because of a gain of output from the two transistors, i.e., optical isolator transistor portion 218 and first transistor 224. Therefore, an output to the microprocessor is about 5 volts for all input voltages above the threshold and is about zero for all input voltages below the threshold.

Circuit configuration 200 may be connected to the microprocessor between seventh resistor 222 and second transistor 224, as shown by arrow 230. The microprocessor may be any microprocessor external or internal with the HVAC system. Preferably, the microprocessor is an existing microprocessor that controls the HVAC system. Use of the existing microprocessor eliminates need for an additional component or voltmeter external to the HVAC system. The existing microprocessor is at a low voltage or ground and voltages of the HVAC system are high voltages, such as, for example, 250 VAC, so the microprocessor must be isolated from the high voltages being measured. Optical isolator 216 provides complete electrical separation between the voltage being measured and the microprocessor. Optical isolator 216 provides a completely floating ground for each measured signal or AC voltage. Advantageously, circuit configuration 200 isolates the microprocessor from the high voltages. Prior art systems require multiple voltmeters to measure multiple voltages. Use of the existing microprocessor may measure multiple voltages that do not have common grounds without requiring multiple voltage meters and leads to reduced cost.

The circuit 200 converts a wave of the sinusoidal voltage into the pulse for the microprocessor. The microprocessor measures the duration of the pulse. Preferably, the pulse duration is measured by 1 megahertz clock of the microprocessor. The microprocessor may start timing the pulse duration at a rise of the pulse and ends timing the pulse duration at a fall of the pulse. Time duration of the pulse is a function of the line voltages, preferably, amplitude of the line voltage.

A control including the microprocessor and circuit may be calibrated. When the control is manufactured, a known AC voltage may be applied to the circuit and a resultant pulse width is measured by the microprocessor. The microprocessor has a memory to store the resultant pulse width associated with the known AC voltage. The stored pulse duration is used as a calibration constant, accurately calibrating the control to read a value of the known applied voltage. When other voltage values are measured, the same calibration constant adjusts readings by the microprocessor to a correct value. The calibration process increases accuracy, such as, for example, to within 2% to 3% of the AC voltage of the HVAC system, and uniformity of the measured voltage from HVAC system to HVAC system. The calibration process may be performed when the control is manufactured. The control may then be installed into the HVAC system during manufacture thereof.

The microprocessor converts the pulse duration into a measured voltage of the HVAC system. The microprocessor may convert the pulse duration into the measured voltage by mathematically converting the pulse duration into a voltage, such as, for example, by a trigonometric translation. The trigonometric translation may be, such as, for example, the following equation 1:

measured voltage=reference voltage*[sin(90 deg.−½ ref deg.)]/[sin(90 deg.−½meas deg.)]

The reference voltage is the calibrated voltage. The meas. deg. is the measured pulse duration. The ref. deg. is the calibration pulse duration of the calibration voltage. The measured voltage is the AC voltage in the HVAC system. It should be noted that this is a mathematical formula used in the preferred embodiment. Other variations of the mathematics based on the same principles can be arrived at by anyone skilled in the art. This could be done with a trigonometric routine or a piecewise linear interpolation of a lookup table defined by the above sin calculation, for example, where table input is the pulse duration and table output is the complete sin function. The calibration can result in better than 1% accuracy measurements using 10% tolerance components. The microprocessor may read and independently measure each line cycle with information available a few milliseconds after the end of the measured pulse.

Figure 2:
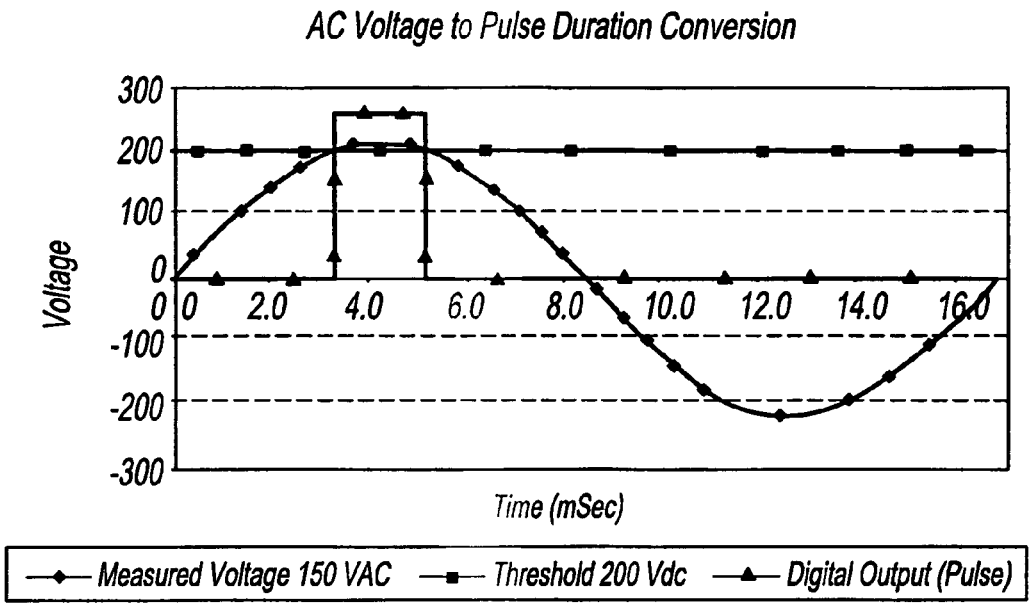
FIG. 2 is a graphical depiction of AC voltage to pulse duration conversion.

FIG. 2 shows a superposition of a measured voltage that is equal to 150 VAC onto a pulse duration converted from the 150 VAC measured voltage. FIG. 2 also shows a threshold that is equal to 200 Vdc. The resultant pulse is high or at a peak while the measured voltage is above 200 volts and is low, relative to the peak, while the measured voltage is below 200 volts, as shown in FIG. 2. Thus, the higher the measured voltage, the longer the pulse duration is at a high value. Since a time period for a full or half cycle of a 60 cycle AC line is precisely controlled, correlation of the pulse duration with the measured voltage is possible.

Figure 3:
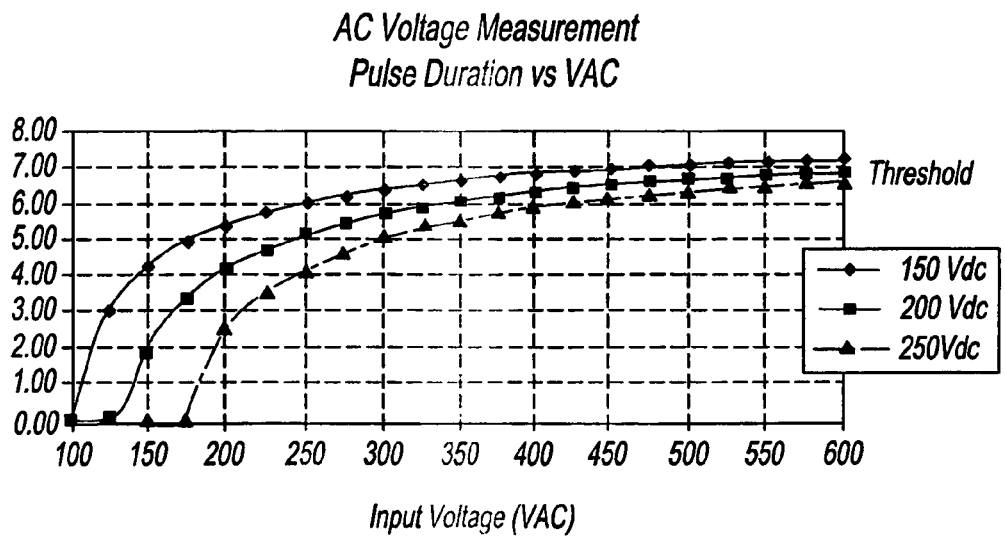
FIG. 3 is a graphical depiction of AC voltage measurement pulse duration to VAC.

FIG. 3 shows a relationship between the measured voltage and pulse duration for a 60 Hz input signal for thresholds of 150Vdc, 200Vdc, and 250Vdc. FIG. 3 also illustrates that the pulse duration may vary with a threshold value of the threshold voltage of the circuit. The threshold may vary, such as, for example, due to circuit component values and tolerances. The calibration constant compensates variations in the threshold voltage of the circuit for accurate measurements, such as, for example, due to inaccurate components in the circuit. Different ranges of AC voltages may be measured by adjusting the DC threshold to achieve accuracy over those AC voltages.

For example, first diode 202 and second diode 204 are in series and block a negative half wave of the current to reduce power dissipation in resistors 206, 208, 210, and 212. First portion 201 conducts for all input voltages above an input threshold, such as, for example, of about 1 volt. An opto collector load of optical isolator 216 and a stage of gain following optical isolator 216 establish a switching level of output current of optical isolator 216 of about 42 microamps with a square positive pulse fed to the microprocessor. The pulse duration at a minimum voltage reading, preferably, is about 4 milliseconds (ms), and, preferably, about 7 ms at a high or maximum reading, as shown in FIG. 3. The microprocessor may measure this pulse duration at a resolution of 1 microsecond, which gives sufficiently high resolution for all readings. 4 milliseconds is 4000 microseconds. With a resolution of 1 microsecond, the reading resolution is at worst ¼₀₀₀, or 0.00025 which is more than adequate.

The circuit may be calibrated in a factory at one temperature, such as, for example, room temperature or approximately 75 degrees Fahrenheit, but the HVAC system must be accurate at other temperatures as well. For example, the HVAC system may be located outside in a broad temperature range, e.g., about 0 degrees Fahrenheit to about 125 degrees Fahrenheit. The circuit may compensate for inaccuracies due to variations in temperature. Preferably, fifth resistor 214 in parallel with first portion 201 of circuit configuration 200 may have an electrical resistance selected so that the circuit is self temperature compensating. Preferably, the electrical resistance is equal to 750 ohms. With increasing temperature, the current transfer ratio of optical isolator 216 decreases and the forward drop of optical isolator diode portion 217 decreases, which forces more current through the optical isolator. The electrical resistance of 750 ohms balances the decreasing current transfer ratio of optical isolator and the decreased forward drop of optical isolator diode portion 217 so that their net effect is zero.

Testing performed at a temperature range of 17 degrees, 75 degrees, and 125 degrees resulted in all readings having accuracy within 1% over the temperature range and over a 3 to 1 measured voltage range. Advantageously, accuracy over a wide temperature range that is significantly better than a typical voltage sensing relay may be achieved. However, instrumentation grade accuracy is not required. As discussed above, circuit configuration 200 may be manufactured at a low cost in contrast to prior art voltmeters, which use relatively expensive methods of insuring accuracy at a temperature range.

Circuit configuration 200, preferably, has a threshold of about 75 VRMS. Preferably, the measured voltage is between 100 and 300 VRMS for optimal accuracy and resolution. Preferably, a maximum withstand voltage is 490 VRMS at ½ watt dissipation in each of the 15K resistors, such as, for example, first resistor 206, second resistor 208, third resistor 210, fourth resistor 212.

Measurement of line AC voltage that powers the system can prove to be quite beneficial. For example, the system could protect itself by shutting down some or all of its components in the event that this line voltage is too high or too low. The system can adjust some operating parameters such as compressor capacity or air flow in response to changes in line voltage. In some systems the measured line voltage may be displayed to assist a service technician. Measurement of AC voltage is also useful in other areas of the system such as across the start or run windings of the compressor motor. Knowledge of these voltages can help in achieving robust starting of the compressor motor and in diagnosing compressor related faults.

It must be noted that measuring a voltage is different from merely "sensing" its presence. A voltage is sensed if its level is higher than some preset threshold value and not sensed otherwise. Advantageously, by measuring the voltage, a microprocessor can detect exactly what the level is and can use it for multiple purposes.

While the instant disclosure has been described with reference to one or more exemplary embodiments, it will be understood by those skilled in the art that various changes may be made and equivalents may be substituted for elements thereof without departing from the scope thereof. In addition, many modifications may be made to adapt a particular situation or material to the teachings of the disclosure without departing from the scope thereof. Therefore, it is intended that the disclosure not be limited to the particular embodiment(s) disclosed as the best mode contemplated for carrying out this invention, but that the invention will include all embodiments falling within the scope of the appended claims.

What is claimed is:

1. A control system to measure a sinusoidal AC voltage in a heating, ventilation, and air conditioning system, the system comprising:
    a controller;
    a circuit connected to said controller, said circuit generating a pulse voltage based upon the AC voltage, said pulse voltage having a pulse duration, wherein said controller measures a measured pulse duration based on said pulse duration and determines the AC voltage based upon said measured pulse duration;
    wherein said controller is subjected to a calibration process by applying a known AC reference voltage to the circuit, converting said AC reference voltage into a reference pulse, measuring a duration of said reference pulse, and storing values of the AC reference voltage and said reference pulse duration in the controller's memory; and
    wherein said AC voltage is determined based upon said measured pulse duration, said AC reference voltage, and said reference pulse duration.

2. The control system of claim 1, wherein said controller is a microprocessor that controls the heating, ventilation, and air conditioning system.

3. The control system of claim 1, wherein said circuit is a plurality of circuits, and wherein said controller and said plurality of circuits measure multiple voltages from the heating, ventilation, and air conditioning system.

4. The control system of claim 1, wherein said AC voltage is determined based upon a said mathematical formula comprising:
    AC voltage=AC reference voltage*[sin(90 deg.−½ reference pulse duration)]/[sin(90 deg.−½ measured pulse duration)], and wherein said measured pulse duration and said reference pulse duration are expressed in angular degrees of sinusoidal waves of the AC voltage and the AC reference voltage, respectively.

5. The control system of claim 1,
    wherein said circuit comprises a first resistor network, an optical isolator having a diode portion and a transistor portion, and a second network having a plurality of resistors and a transistor, wherein said first resistor network divides an input sinusoidal AC voltage by a fixed ratio, wherein said input sinusoidal AC voltage that is divided is sensed by said optical isolator diode portion,
    wherein said second network is connected to said transistor portion such that a first voltage level is generated while said input sinusoidal AC voltage is above a fixed threshold and a second voltage level is generated while said input sinusoidal AC voltage is below said fixed threshold thereby generating a pulse voltage based on said input sinusoidal AC voltage with said optical isolator electrically isolating said first resistor network from said second network; and
    wherein said circuit further comprises a parallel resistor that is connected across said diode portion of said optical isolator and has an electrical resistance which is selected to substantially cancel effects of decreasing current transfer ratio of said optical isolator and decreasing forward drop of said diode portion of said optical isolator as temperature increases.

6. The control system of claim 5,
    wherein said circuit further comprises a parallel resistor that is connected across said diode portion of said optical isolator and has an electrical resistance which is selected to substantially cancel effects of decreasing current transfer ratio of said optical isolator and decreasing forward drop of said diode portion of said optical isolator as temperature increases.

7. A method of measuring voltage in a heating, ventilation, and air conditioning system, comprising:
    converting a reference sine wave of a known voltage into a reference pulse with an electrical circuit;
    measuring a reference pulse duration of said reference pulse with a controller;
    converting said reference pulse duration into a reference voltage;
    converting a sinusoidal voltage into a measured pulse with the electrical circuit;
    measuring a measured pulse duration of said measured pulse with the controller; and
    converting said measured pulse duration into a measured voltage;
    wherein said measured voltage is determined by the controller based upon said reference voltage, said reference pulse duration, and said measured pulse duration.

8. The method of claim 7, wherein said measured voltage is determined by a mathematical formula that includes said measured voltage=reference voltage*[sin(90 deg.−½ reference pulse duration in angular degrees of said reference sine wave)]/[sin(deg.−½ measured pulse duration in angular degrees of said sinusoidal voltage.

9. The method of claim 7 further comprising substantially electrically isolating said controller from said sinusoidal voltage.

10. A control system to measure a sinusoidal AC voltage in a heating, ventilation, and air conditioning system, the system comprising:
    a controller; and
    a circuit connected to said controller, said circuit generating a pulse voltage based upon the AC voltage, said pulse voltage having a pulse duration, wherein said controller measures a measured pulse duration based on said pulse duration and determines the AC voltage based upon said measured pulse duration;
    wherein said circuit comprises a first resistor network, an optical isolator having a diode portion and a transistor portion, and a second network having a plurality of resistors and a transistor;
    wherein said first resistor network divides an input sinusoidal AC voltage by a fixed ratio;
    wherein said input sinusoidal AC voltage that is divided is sensed by said optical isolator diode portion;
    wherein said second network is connected to said transistor portion such that a first voltage level is generated while said input sinusoidal AC voltage is above a fixed threshold and a second voltage level is generated while said input sinusoidal AC voltage is below said fixed threshold thereby generating a pulse voltage based on said input sinusoidal AC voltage with said optical isolator electrically isolating said first resistor network from said second network; and
    wherein said circuit further comprises a parallel resistor that is connected across said diode portion of said optical isolator and has an electrical resistance which is selected to substantially cancel effects of decreasing current transfer ratio of said optical isolator and decreasing forward drop of said diode portion of said optical isolator as temperature increases.

11. The control system of claim 10, wherein said controller is a microprocessor that controls the heating, ventilation, and air conditioning system.

12. The control system of claim 10, wherein said circuit is a plurality of circuits, and wherein said controller and said plurality of circuits measure multiple voltages from the heating, ventilation, and air conditioning system.

13. The control system of claim 10, wherein said controller is subjected to a calibration process by applying a known AC reference voltage to the circuit, converting said AC reference voltage into a reference pulse, measuring a duration of said reference pulse, and storing values of the AC reference voltage and said duration in the controller's memory.

14. The control system of claim 10, wherein said AC voltage is determined based upon said duration by a mathematical formula using said values of said AC reference voltage and said duration from said calibration process.

* * * * *